United States Patent [19]

Nishio et al.

[11] Patent Number: 5,774,842
[45] Date of Patent: Jun. 30, 1998

[54] NOISE REDUCTION METHOD AND APPARATUS UTILIZING FILTERING OF A DITHERED SIGNAL

[75] Inventors: Ayataka Nishio; Tohru Sugihara, both of Kanagawa, Japan

[73] Assignee: Sony Corporation, Tokyo, Japan

[21] Appl. No.: 634,394

[22] Filed: Apr. 18, 1996

[30] Foreign Application Priority Data

Apr. 20, 1995 [JP] Japan ..................................... 7-094942

[51] Int. Cl.⁶ .............................. H03M 1/20; H03M 1/00; H04N 5/21
[52] U.S. Cl. ........................... 704/226; 704/212; 704/225; 704/226; 704/227; 704/228; 704/229; 704/230
[58] Field of Search ........................ 395/2.21, 2.34–2.37, 395/2.39, 2.38

[56] References Cited

U.S. PATENT DOCUMENTS

| | | | |
|---|---|---|---|
| 4,812,846 | 3/1989 | Noro ........................................ | 341/131 |
| 4,937,576 | 6/1990 | Yoshio et al. ............................ | 341/131 |
| 4,968,987 | 11/1990 | Naka et al. ............................... | 341/143 |
| 5,073,777 | 12/1991 | Fukuhara et al. ........................ | 341/131 |
| 5,204,677 | 4/1993 | Akagiri et al. ........................... | 341/118 |
| 5,252,973 | 10/1993 | Masuda .................................... | 341/131 |
| 5,388,081 | 2/1995 | Hashimoto et al. ..................... | 348/606 |
| 5,493,296 | 2/1996 | Sugihara .................................... | 341/76 |
| 5,563,913 | 10/1996 | Akagiri et al. ........................... | 375/243 |
| 5,634,082 | 5/1997 | Shimiyoshi et al. .................... | 395/2.38 |

*Primary Examiner*—David R. Hudspeth
*Assistant Examiner*—M. David Sofocleous
*Attorney, Agent, or Firm*—Jay H. Maioli

[57] ABSTRACT

A noise reducing method and apparatus for reducing quantization error or noise generated on quantizing input signals, such as digital audio signals, wherein a dither signal concentrated in signal energy in the low frequency range is summed to the input signal and the resulting sum signal is sent to a quantizer. The quantizer error generated in the quantizer is fed back via a noise filter to the input side of the quantizer. The resulting signal has a smoothed noise floor and has noise components suppressed in a frequency range to which the human hearing mechanism exhibits high sensitivity, thus realizing the sound quality comparable to that of the input signal which prevailed prior to noise shaping.

4 Claims, 16 Drawing Sheets

NOISE REDUCTION METHOD AND APPARATUS UTILIZING FILTERING OF A DITHERED SIGNAL

BACKGROUND OF THE INVENTION

1. Field of the Invention

This invention relates to a noise reducing method and apparatus for reducing quantization error or noise generated upon quantizing input signals, such as digital audio signals.

2. Description of the Related Art

Among digital audio equipment handling digital format audio signals, there are currently a reproducing apparatus for a so-called compact disc and a so-called digital audio tape recorder (DAT). A variety of unification standards have been prescribed for this digital audio equipment. For example, the bit lengths of the digital audio signals, handled by this equipment, are prescribed by these unification standards to 16 bits. This digital audio equipment uses digital audio signals obtained on encoding analog audio signals, that is speech waveform signals, by simple linear quantization, that is linear pulse coding, or so-called PCM.

In the above-described digital audio equipment, there is a demand for the playback sound higher in psychoacoustic sound quality than the playback sound actually produced by the above-mentioned unification standards. For producing the playback sound with psychoacoustically better sound quality, it is felt to be effective to reduce the noise components contained in the digital audio signals handled by the digital audio equipment. The playback sound produced from the audio signals reduced in noise components suffers from the noise to a lesser extent and is of psychoacoustically superior sound quality.

Among the noise component reducing operations for these digital audio signals, there is known a quantization error reducing operation by so-called error feedback used in, for example, quantization of audio signals. This operation involves feeding back the quantization error (quantization noise or quantization distortion) generated on quantizing audio signals by a quantizer to the input of the quantizer via a noise filter.

The noise reducing apparatus employing such error feedback is disclosed in JP Patent Kokai Publications JP-A-4-72906 and JPA-4-72908 proposed by the present Assignee. The techniques disclosed in these Publications reside in so-called noise shaping consisting in changing the frequency distribution of the quantization noise by the error feedback. That is, the noise distribution is changed in association with the allowable noise spectrum taking into account the masking and the audible range for the human being for reducing the noise as heard by the ear.

FIG. 1 shows the basic arrangement of a noise reducing apparatus for reducing the noise by noise shaping by error feedback as previously proposed by the present Assignee in JP Patent Kokai Publications JP-A-4-72906, JP-A-4-72908 and JP-A-4-72909.

Referring to FIG. 1, a digital audio input signal, supplied to an input terminal 1, is sent by an adder 10 to a quantizer 11 where it is re-quantized and outputted at an output terminal 2. The quantization error generated in the quantizer 11 is routed by a subtractor 12 to the adder 10 via a noise filter 13 for error feedback so as to be summed to the input signal.

FIG. 2 shows an equal loudness curve obtained on the basis of the hearing sense of the human being. This equal loudness curve is obtained by interconnecting sound pressure curve segments for respective narrow frequency bands that are heard with the same loudness as the sound pressure of the 1 kHz pure tone, and is also termed a equal sensitivity curve for loudness (sound magnitude).

It is seen from FIG. 2 that the sensitivity of the human acoustic sense is gradually lowered from about 200 Hz of the low frequency range to an ultra-low frequency range and is high in a range from about 500 Hz to 4 kHz.

The noise filter for error feedback 13 having frequency characteristics designated by a curve MR in FIG. 3 is employed for taking into account the above-mentioned equal loudness curve and the so-called masking effects.

The output signal obtained at the output terminal 2 of the noise reducing apparatus, configured as shown in FIG. 1, has a low noise in a frequency range from 500 Hz to 4 kHz, to which the ear of the human being has high sensitivity, but has a non-smooth noise level. Thus there are occasions wherein the output signal appears to have been slightly modified in the frequency balance as perceived by the ear from the sound that existed prior to noise shaping, even although the output signal remains high in clarity.

If the noise shaping is deemed to be a quantizer having the quantization level which is changed with the frequency, the input signal may be expected to be smoothed by summing a dither to the input signal and subsequently noise-shaping the signal, even although the noise floor is increased.

Thus the present Assignee has proposed in JP Patent Kokai Publication JP-A-6-46489 a noise reducing apparatus configured as shown in FIG. 5.

The noise reducing device shown in FIG. 5 includes a dither generating circuit 21, in addition to the components shown in FIG. 1. A dither signal from the dither generating circuit 21 is supplied to the adder 10 so as to be summed to the input signal, and the resulting sum signal is supplied to the quantizer 11.

The dither generating circuit 21 of FIG. 5 outputs dither signals having flat frequency characteristics as shown in FIG. 6. Thus the output signal at the output terminal 2 of the noise reducing device has a smooth noise floor, as shown for example in FIG. 7. Although the noise floor may be smoothed by summing a dither to the input data of the noise shaping circuit, the noise in the frequency range from 500 Hz to 4 kHz, to which the ear of the human being has high sensitivity, is slightly increased as compared to the output signal of FIG. 4, obtained by the constitution of FIG. 1, such that, even although the frequency balance as perceived by the ear is improved, the output sound is of a slightly rough sound quality.

Thus it may be contemplated that, if the noise floor can be smoothed without increasing the noise in the range of 500 Hz to 4 kHz for which the ear of the human being has high sensitivity, a noise reducing device may be realized which has merits proper to the constitution of FIG. 1 and that of FIG. 5.

It is noted that the noise floor can be smoothed by adding some sort of the random noise or the dither to the input signal. However, the noise reducing device improves the resolution in the mid to low range by noise shaping at the cost of the increased quantization noise in the high range in consideration that the hearing sense of the human being becomes significantly insensitive to the high range, thereby enabling reproduction of the input signal with the similar sound quality with the number of bits smaller than the original number of bits. It is therefore not desirable to use the noise or dither the energy of which is concentrated in the high range, even if such noise or dither having such energy concentration is generally thought to be effective, since then the noise in the high range is increased further.

SUMMARY OF THE INVENTION

It is therefore an object of the present invention to provide a noise reducing methods and apparatus and a recording medium wherein the quantization error (quantization noise) as perceived by the ear may be effectively reduced and the sound quality similar to that of the input signal prior to noise shaping may be produced.

In an illustrative noise reducing method according to the present invention, a dither signal concentrated in energy in low range side is summed to an input signal, the resulting sum signal is fed to a quantizer and the quantization error generated in the quantizer is fed back to the input side of the quantizer via a noise filter.

In a noise reducing apparatus according to the present invention, in which the quantization error generated in the quantizer is fed back via a noise filter to the input side of the quantizer, a dither signal outputting unit is provided for outputting a dither signal having the signal energy concentrated in the low range side, while an addition unit for summing the dither signal from the dither signal outputting unit is summed to the input signal.

More specifically, the noise reducing apparatus according to the present invention includes quantization means for quantizing an input signal, subtraction means for subtracting the input signal to the quantization means from an output signal of the quantization means, filter means supplied with an output of the subtraction means, dither signal outputting means for outputting the dither signal increased in noise power in the low frequency range, and addition means for summing an output of the filter means, the input signal and the dither signal from the dither signal outputting means.

The dither signal outputting means includes dither signal generating means for generating the dither signal having flat frequency characteristics and a filter for increasing the signal level of the low frequency range from the dither generating means.

The dither signal outputting means includes level detection means for detecting the level of the input signal and the dither signal is varied in signal level depending upon an output of the level detection means.

The recording medium according to the resent invention has recorded thereon an output of a quantizer, wherein a dither signal having the signal energy (power) concentrated in a low range is summed to an input signal, the resulting addition signal is sent via a noise filter to an input side of the quantizer and a quantization error generated in the quantizer is fed back via the noise filter to the input side of the quantizer.

The input signal is summed to the dither signal and adjusted. The quantization error generated in the quantization means is fed back via the filter to the input side of the quantization means. By employing a signal having the signal energy concentrated in the low range as a dither signal, noise reduction may be achieved without deteriorating the SN ratio in a frequency range where the sensitivity of the human hearing mechanism is higher.

With the noise reducing method and apparatus of the present invention, the dither signal concentrated in signal energy in the low frequency range is summed to the input signal and the resulting sum signal is sent to a quantizer. The quantizer error generated in the quantizer is fed back via a noise filter to the input side of the quantizer. Thus the resulting signal has a smoothed noise floor and has noise components suppressed in a frequency range to which the human hearing mechanism exhibits high sensitivity. This achieves the sound quality comparable to that of the input signal which prevailed prior to noise shaping.

By summing the dither signal generated responsive to the input signal level to the input signal, the noise becomes hardly perceptible in case of an input signal in which the quantization noise is likely to present problems in connection with the human hearing mechanism, such that the quantization noise ceases to present such problems.

DESCRIPTION OF PREFERRED EMBODIMENTS

Figure 1:
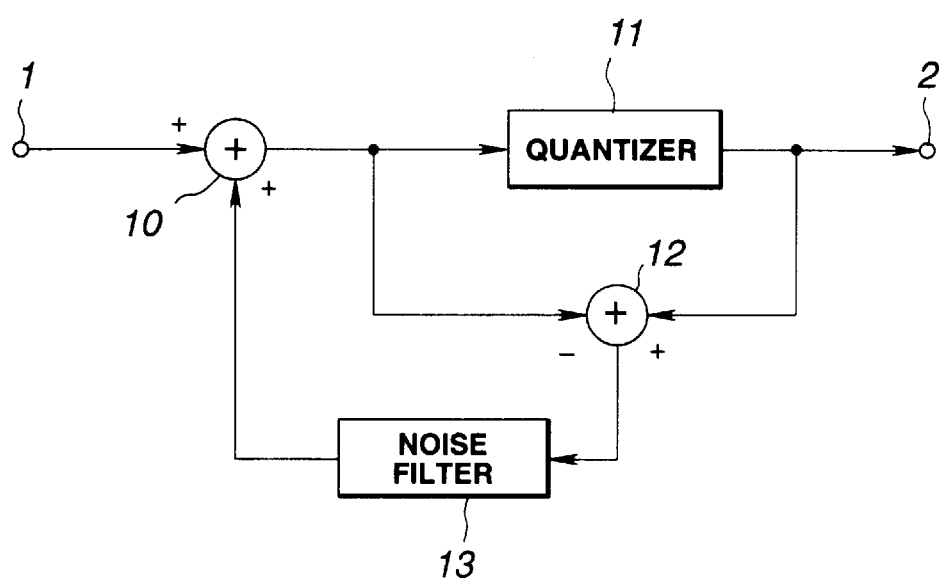
FIG. 1 is a block diagram showing a basic structure of a conventional noise reducing device from which the present invention is started.

Referring to the drawings, preferred embodiments of the present invention will be explained in detail.

Figure 8:
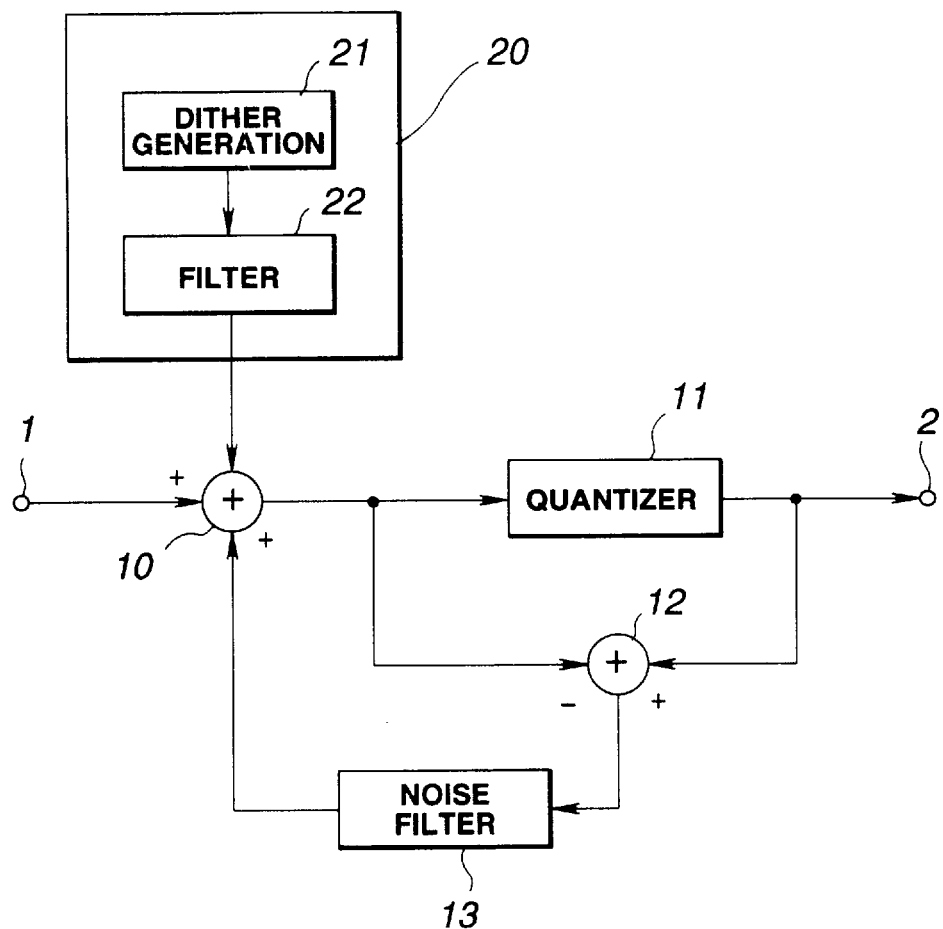
FIG. 8 is a schematic block circuit diagram showing the structure of a noise reducing device for audio signals according to a first embodiment of the present invention.

FIG. 8 shows, in a schematic block diagram, a structure of a noise reducing device according to a first embodiment of the present invention.

In the embodiment of the noise reducing device (quantization error reducing device) shown in FIG. 8, a quantization error generated by a quantizer 11 is fed back via a noise filter 13 to an input side of the quantizer 11. The filter coefficients of the noise filter 13 are set on the basis of the information concerning the so-called equal loudness curve representing psychoacoustic characteristics of the human being.

The digital audio signals, produced on sampling with an arbitrary sampling frequency, is sent to an input terminal 1 of FIG. 1. The digital audio input signal is sent to the adder 10 where it is summed to a dither signal from a dither signal outputting unit 20 having the energy concentrated in a low range. The resulting sum signal is re-quantized in the quantizer 11 and outputted at the output terminal 2. The dither signal comprises a random signal or a pseudo-random signal and is also termed a random noise or a noise.

The noise reducing device of FIG. 8 includes a dither signal output unit 20, and a subtractor 12 for subtracting an input to the quantizer 11 from an output of the quantizer 11 to generate a quantization error generated at the time of quantization by the quantizer 11. The noise reducing device also includes the noise filter 13 having its filter characteristics set with filter coefficients as later explained and adapted for filtering an output of the subtractor 12, and an adder 10 for summing an output of the noise filter 13 to the input of the quantizer 11. The noise reducing device, thus constituted, operates as a so-called error feedback circuit executing the noise shaping which is the operation for reducing the quantization error.

The dither signal output unit 20 of the present embodiment is made up of a dither generating circuit 21 and a filter 22. The dither generating circuit 21 generates dither signals having flat characteristics. The filter 22 has frequency characteristics of strengthening the low range or attenuating the high range for concentrating the energy of the dither signal in the low range.

Figure 9:
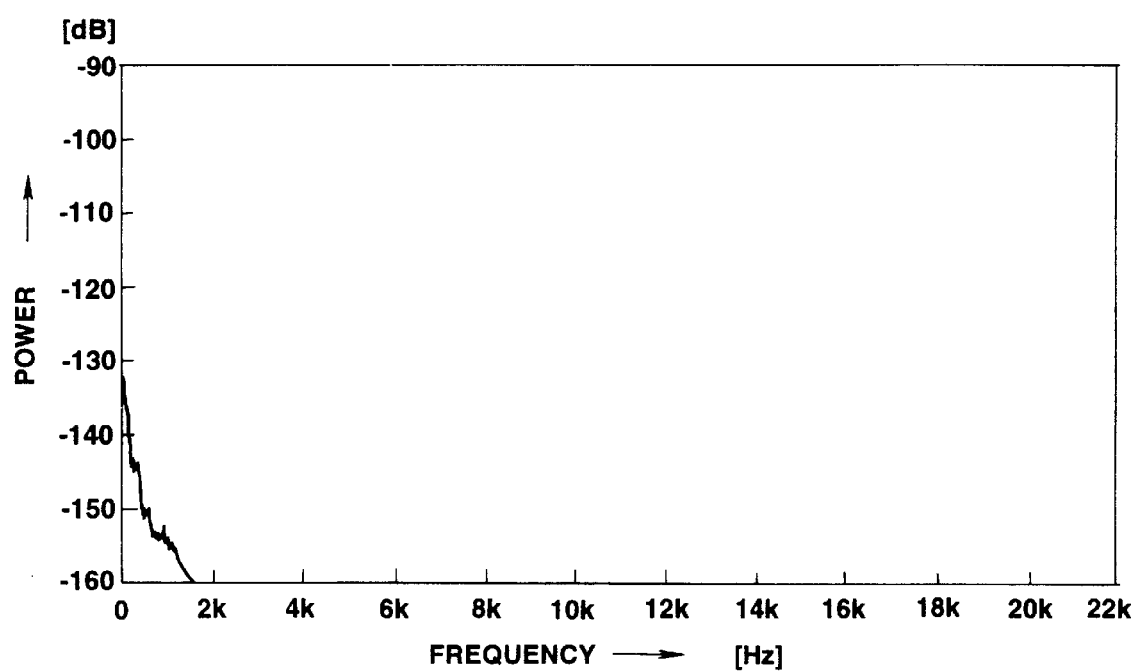
FIG. 9 is a graph showing a spectrum of a typical dither signal having its energy concentrated in the low range.

FIG. 9 shows typical frequency characteristics of the dither signal output by the dither signal output unit 20. In the graph of FIG. 9, the dither or noise energy is high in the low range not higher than 200 Hz and is at a level of, for example, −140 dB, whereas, in the mid to high range, the noise energy is decreased significantly. Although the level not higher than −160 dB is not shown in the graph of FIG. 9, the noise in the high range side is at a level lower than −160 dB.

By supplying the noise or the dither having the energy concentrated in the low range from the dither signal output unit 20, the noise floor may be smoothed for further improving the sound quality without increasing the noise as perceived by the ear. The noise floor means fine irregularities in the noise spectral curve and smoothing the noise floor means smoothing the noise spectrum.

The arrangement of FIG. 8 is also a noise reducing device to which the noise reducing method according to the present invention is applied. That is, the dither signal output unit 20 outputs a dither signal having the signal energy concentrated in the low range. This dither signal, having the signal energy concentrated in the low range, is summed by the adder 10 to the input signal and sent to the quantizer 11. The quantization error generated in the quantizer 11 is taken by the subtractor 12 and fed back to the input side of the quantizer 11.

Figure 3:
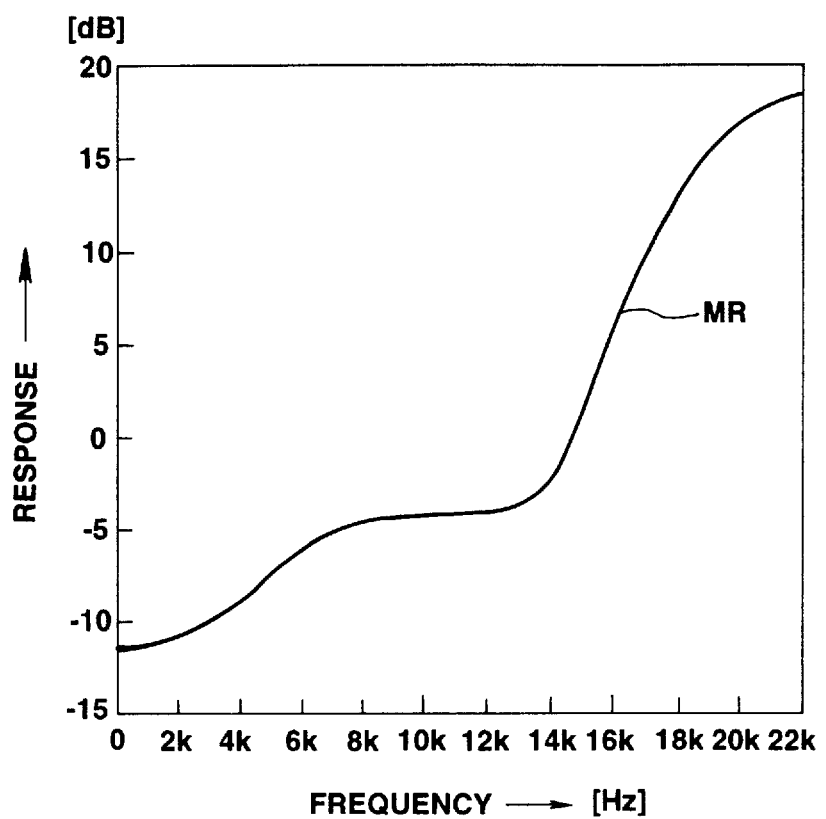
FIG. 3 is a graph showing typical frequency characteristics of a noise filter.
Figure 4:
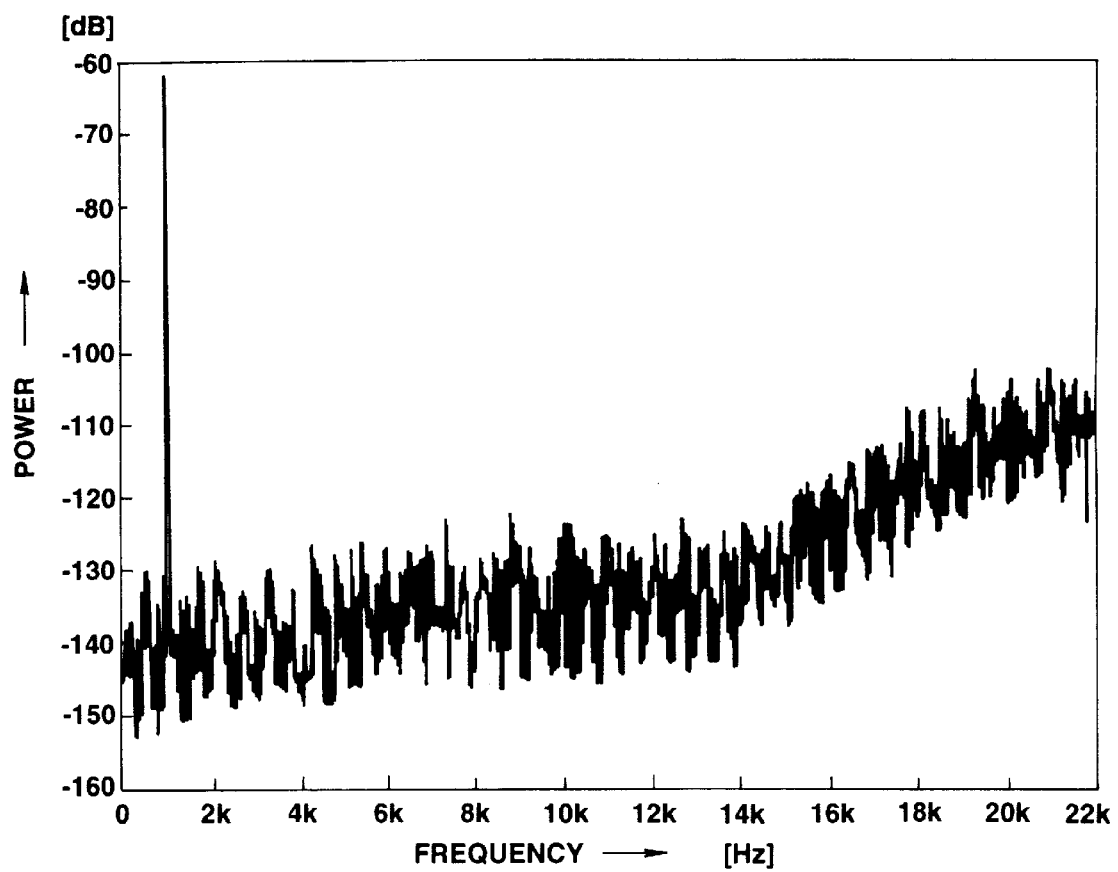
FIG. 4 is a graph showing a spectrum of a typical output signal of the noise reducing device of FIG. 1.
Figure 5:
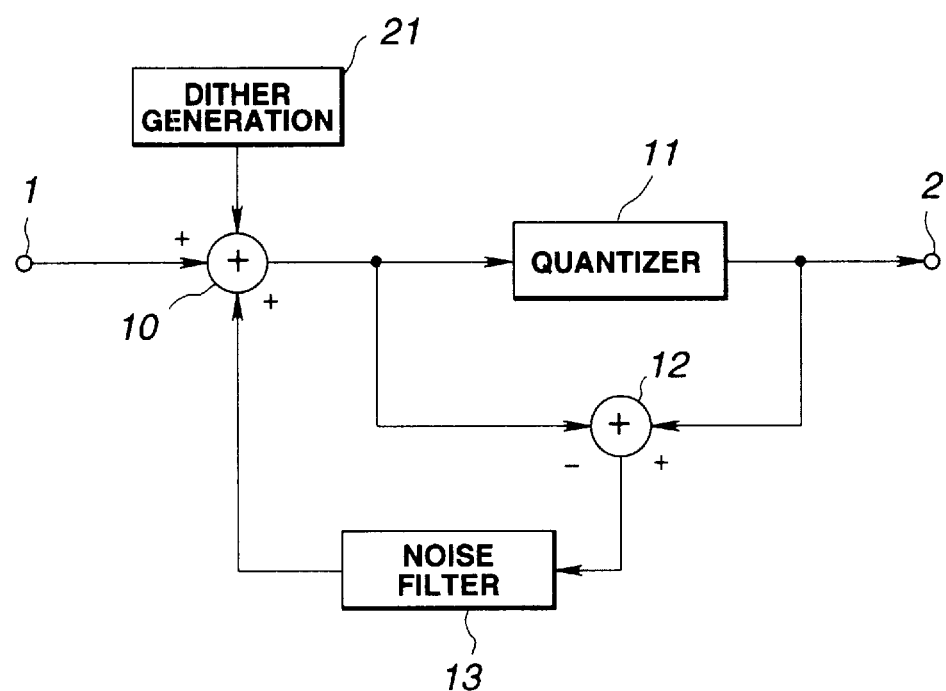
FIG. 5 is a block diagram showing a basic structure of another conventional noise reducing device from which the present invention is started.
Figure 6:
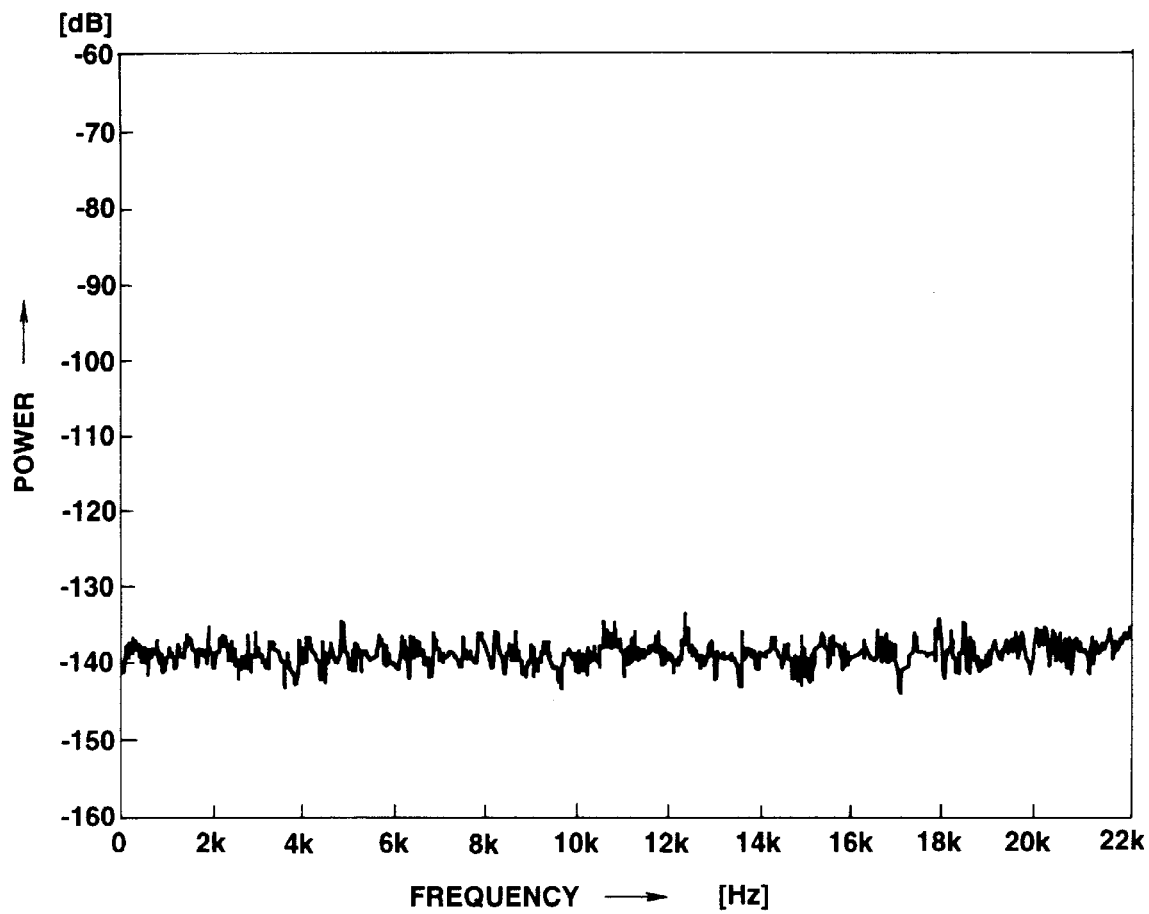
FIG. 6 is a graph showing a spectrum of a typical dither signal of the noise reducing apparatus of FIG. 5.
Figure 7:
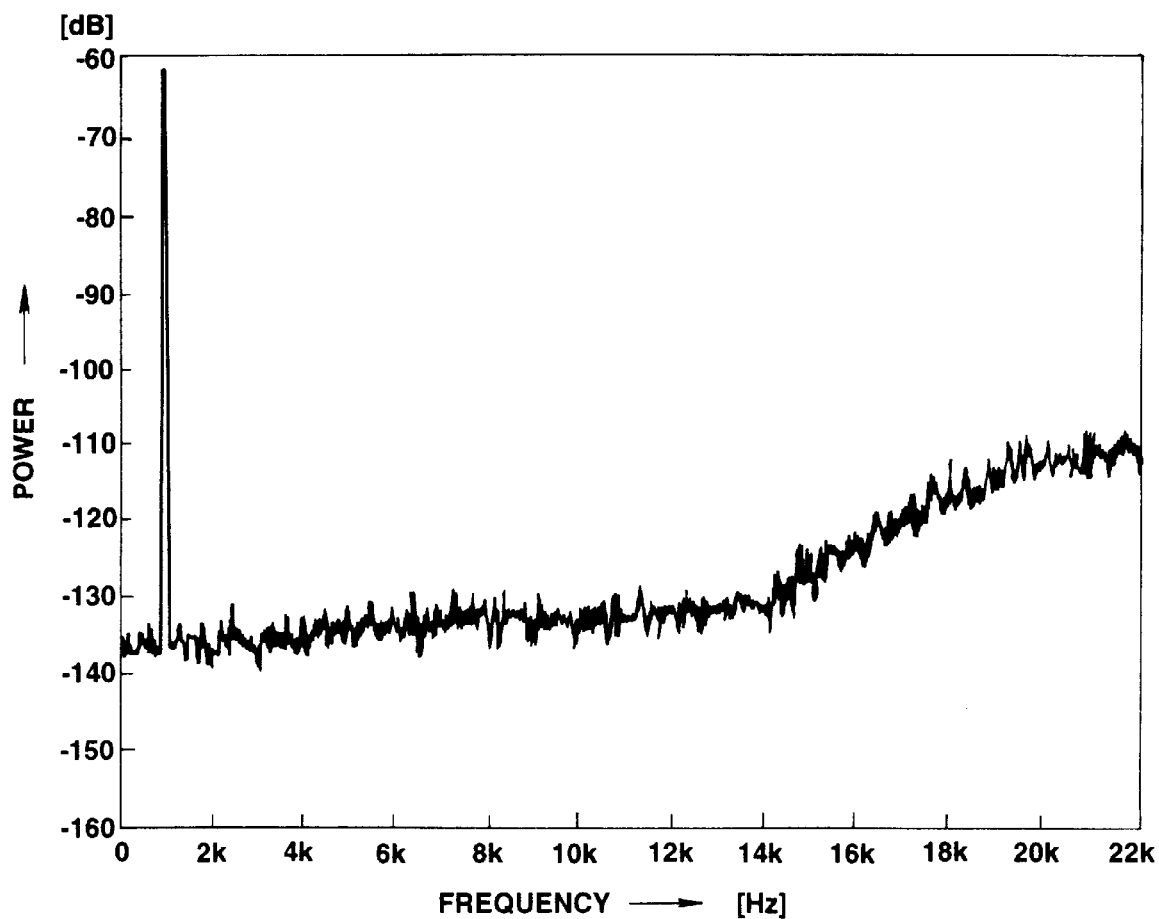
FIG. 7 is a graph showing a spectrum of a typical output signal of the noise reducing device of FIG. 5.
Figure 10:
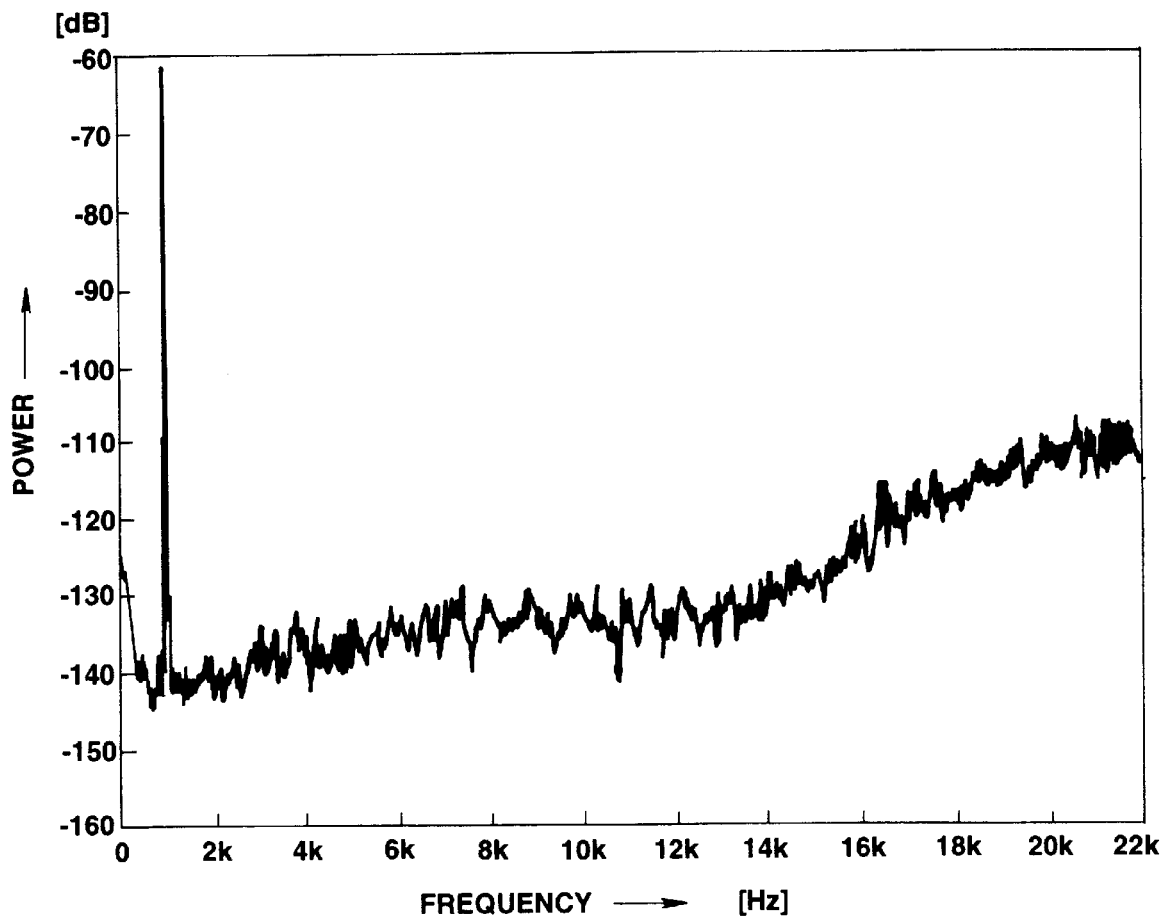
FIG. 10 is a graph showing a spectrum of a typical output signal of a first embodiment of the present invention.

FIG. 10 shows a typical example of an output signal obtained at the output terminal 2 in case of using the first embodiment shown in FIG. 3. In the graph of FIG. 10, the input signal is a pure tone of 1 kHz. It is seen from FIG. 10 that, even although the noise is increased in a range not higher than 200 Hz, the noise is low in the range from 500 Hz to 4 kHz for which sensitivity of the human hearing sense is high, while the noise floor is smooth, so that the sound clarity and the frequency balance as perceived by the ear are extremely close to the sound prior to noise shaping.

By recording the output signal obtained at the output terminal 2 of FIG. 8 on a recording medium, such as an optical disc, a magneto-optical disc, a magnetic disc or a magnetic tape, and by putting the recording medium, thus produced, on the market, the sound quality equivalent to upper order 20 bits may be achieved while observing the format of 16 bits per sample.

The dither having the signal energy concentrated in the low range is not limited to the example of FIG. 9. In general, it is possible to use such dither signal having a spectrum in which the noise power is high in the low range and the noise power is decreased significantly in the mid to high range.

Figure 11:
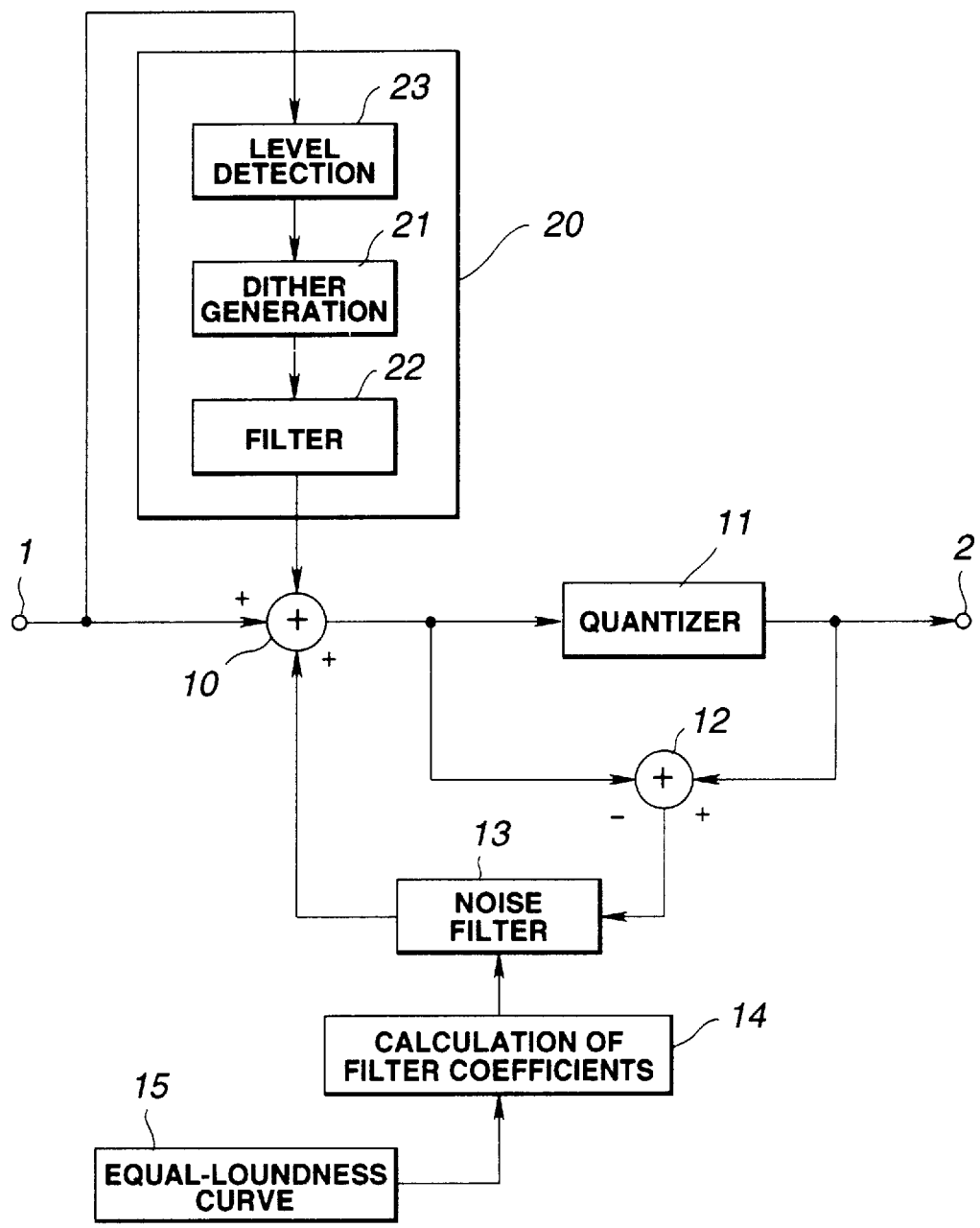
FIG. 11 is a schematic block circuit diagram showing the structure of a noise reducing device according to a second embodiment of the present invention.

FIG. 11 shows a second embodiment of the present invention.

In this figure, a dither signal output unit 20 has, in addition to the dither generating circuit 21 and the filter 22, a level detection circuit 23 for detecting the level of the input signal at the input terminal 1. An output signal of the level detection circuit 23 controls the dither generating circuit 21. The noise filter 13 is fed with filter coefficients calculated by a filter coefficient calculating circuit 14, which is fed with the information concerning an equal loudness curve from an equal loudness curve generating circuit 15. Since the present embodiment is otherwise similar to that shown in FIG. 1, similar parts or components are denoted by corresponding reference numerals and the corresponding description is omitted for simplicity.

In the second embodiment, shown in FIG. 11, the level or characteristics of the dither signal, generated by the dither generating circuit 21, are determined by the characteristics of the classes of the input signal to be processed. Among typical dithers, there are a so-called white dither, representing theoretically optimum non-correlation, and having similar intensity over the entire frequency, a so-called high-frequency dither, having the signal energy concentrated in the range of the signal spectrum outside the audible range for reducing the noise as perceived by the ear, and an all-zero dither which may be preferably employed for an input signal which is sufficiently random to preclude the necessity of providing higher non-correlation.

The level detector 23 is employed for controlling the type and/or the level of the dither generated by the dither generating circuit 21. For example, it is not appropriate to sum a dither to an all-zero input signal. Consequently, this condition is detected by the level detection circuit 23 for optimally controlling the dither generating circuit 21. The low-level input signal is occasionally in need of a larger dither than that required by the high-level signal, so that the dither level is gradually decreased with an increased signal level.

With the present second embodiment, the dither signal generated responsive to the input signal level is summed to the input signal in order to render the noise imperceptible for an input signal in which the quantization noise presents a problem in connection with the hearing sense, so that the quantization noise no longer presents such problem.

Figure 2:
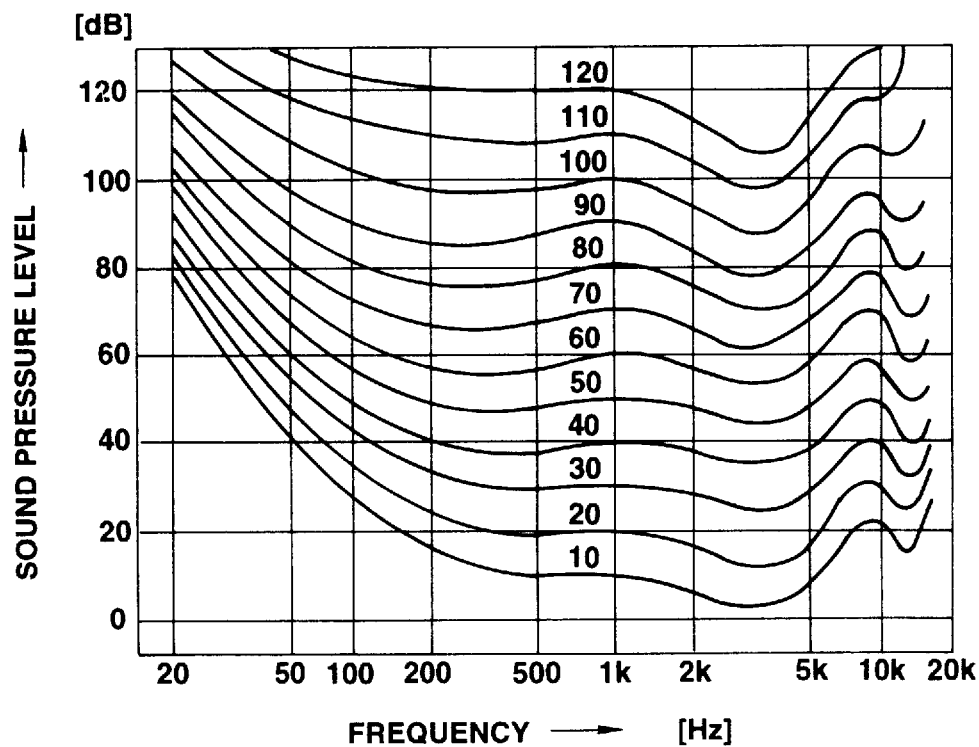
FIG. 2 is a graph showing equal loudness curves.

The noise reducing device or the quantization error reducing device of the present second embodiment has the equal loudness curve generating circuit 15 for generating data of the equal loudness curve representing the psychoacoustic characteristics of the human being, as shown in FIG. 2, and the filter coefficient calculating circuit 14 for calculating filter coefficients of the noise filter 13 based upon an output of the equal loudness curve generating circuit 15.

The information concerning the equal loudness curve or a curve similar thereto, that is the information on the allowable noise spectrum, is outputted by the equal loudness curve generating circuit 15, and supplied to the filter coefficient calculation circuit 14. The calculated filter coefficients are further sent to the noise filter 13. By noise shaping the audio signals by the error feedback circuit employing the noise filter 13 having the filter coefficients based upon the information pertinent to the equal loudness curve, the dynamic range as perceived by the ear may be improved. That is, by executing noise shaping employing the allowable noise spectrum obtained with the equal loudness curve being taken into account, the noise shaping that is more effective in view of the hearing sense may be derived for improving the dynamic range for the playback sound as perceived by the ear.

In the present second embodiment, the so-called masking effect is taken in to account in determining the filter characteristics of the noise filter 13. The masking effect is such a phenomenon in which, due to certain psychoacoustic characteristics of the human being, a signal is masked by another signal and becomes inaudible. The masking effect includes that for time-domain signals, that is, the temporal masking, and that for frequency-domain signals, that is, the concurrent masking. If there is any noise in a masked portion, such noise is made inaudible by the masking effect. If the technique by the quantization error reducing processing taking the masking effect into account is executed, the dynamic range as perceived by the ear may be improved. For setting the filter characteristics with the masking effect taken into account, filter coefficients in which the masking effect on the frequency domain has been taken into account are pre-set in the filter coefficient calculation circuit 14 of the present embodiment. For handling usual audio signals containing many mid and low range components, fixed filter coefficients taking into account the masking effect for the low range are set. Alternatively, such a technique is employed which will generate adaptive filter coefficients associated with the spectrum of the input audio signal for producing the ability of coping with the masking effect in association with the spectrum of the input audio signal.

In this manner, filter coefficients from the filter coefficient calculation circuit 14 are obtained under a condition in which the equal loudness curve and the masking effect have been taken into account. Thus the filter characteristics of the noise filter 13 are set on the basis of the fixed or adaptive filter coefficients, in which the masking effect has been taken into account, and the filter coefficients having pertinence to the equal loudness curve.

The noise filter 13 operates at this time as a filter having filter characteristics designated by a curve MR of FIG. 3 derived from the masking effect and the equal loudness curve. By providing the noise filter 13 with filter characteristics designated by the curve MR of FIG. 3, the quantization error spectrum sent to the noise filter 13 is varied in agreement with the curve MR. By summing the output of the noise filter 13 to the input audio signal, the quantization error in the quantizer 11 is decreased due to noise shaping. If, in the curve MR of FIG. 3, the above-mentioned equal loudness curve is considered, it may be contemplated to increase the response, that is, to increase the allowable noise, in the frequency range lower than 4 kHz. However, the filter characteristics in the frequency range lower than 4 kHz are set so as to be flat, as in the third embodiment hereinafter explained. The reason such mechanism operates is now explained.

That is, since the equal loudness curve shows acute transition despite the narrow bandwidth, the number of filter orders of the noise filter 13 is increased if the noise filter is prepared for conforming to the equal loudness curve for a frequency lower than 4 kHz. If the number of orders of the filter is increased in this manner, the circuit structure is increased in size and becomes complex. However, the resulting effect is not matched to the increased filter circuit scale. Thus, in the third embodiment, now explained, filter characteristics lower than 4 kHz are flattened, as described above.

Figure 12:
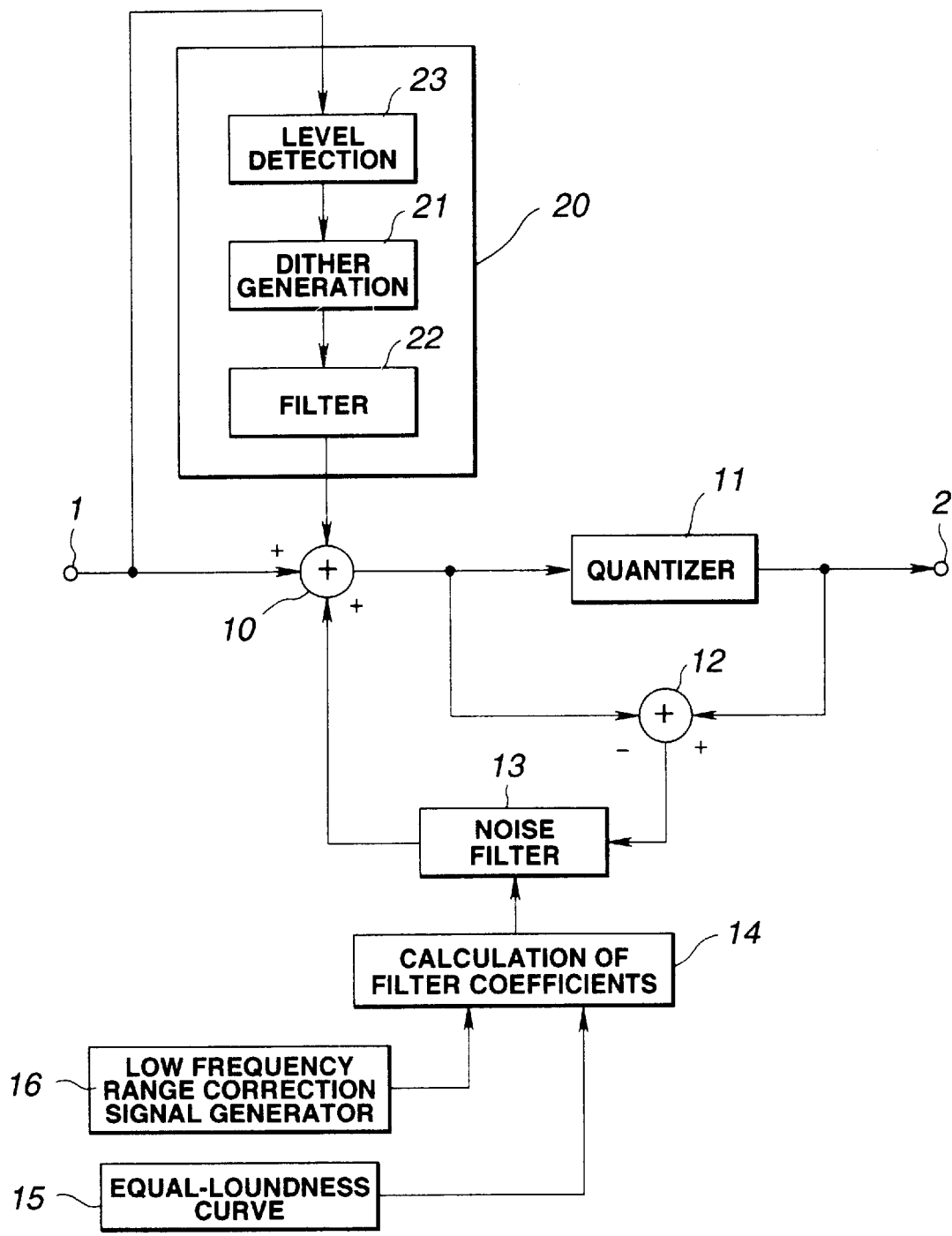
FIG. 12 is a schematic block circuit diagram showing the structure of a noise reducing device according to a third embodiment of the present invention.

FIG. 12 shows a third embodiment of the present invention. In this figure, the blocks corresponding to those of FIGS. 8 and 11 are denoted by the same numerals and the corresponding description is not made. Referring to FIG. 12, a low frequency range correction control signal generating circuit 16 is further provided in addition to the components of the second embodiment shown in FIG. 11. The low frequency range correction signal, generated by the circuit 16, is sent to the filter coefficient calculation circuit 14. This achieves filter characteristics flattened in the low frequency range, as shown by the curve MR of FIG. 3. The low frequency range correction signal is formed with the masking effect being taken into account. In general, the mid to high frequency range is frequently used in the usual audio sound. The above-mentioned masking effect is effective in the mid to high frequency range in the audio sound. Thus, in the noise filter 13 of the present embodiment, the response of the curve MR of the filter coefficient of FIG. 3 is not lowered to the extent that the response of the equal loudness curve is lowered such that the curve MR is more gradual than the equal loudness curve. For achieving this, the filter coefficients are set for taking into account the masking effect, as described above.

Figure 13:
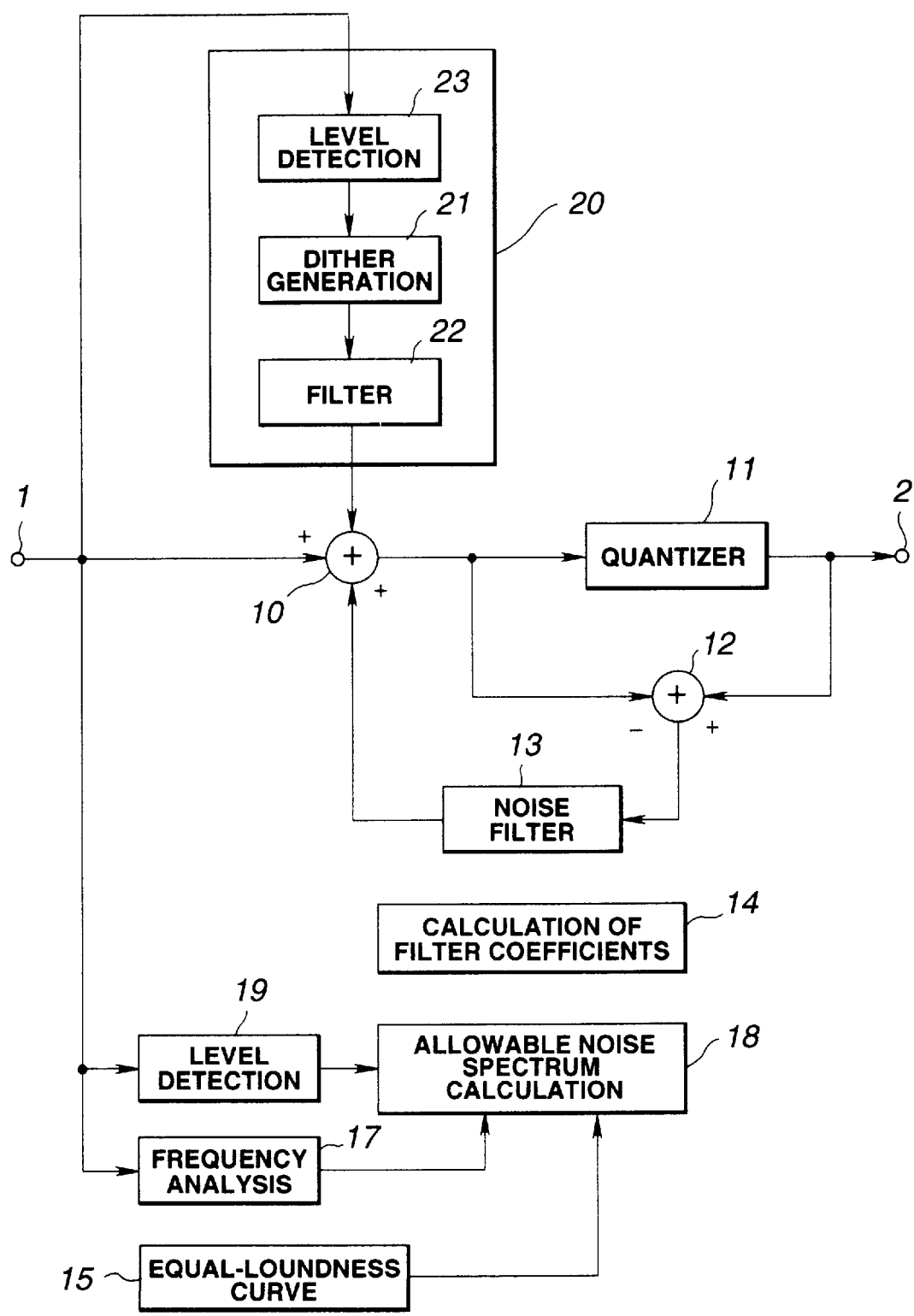
FIG. 13 is a schematic block circuit diagram showing the structure of a noise reducing device according to a fourth embodiment of the present invention.

Referring to FIG. 13, a fourth embodiment exploiting the masking effect is now explained. In this figure, the same numerals are used to denote blocks corresponding to those shown in FIG. 11.

The noise reduction device shown in FIG. 13 is designed to feed back the quantization error generated in the quantizer 11 to the input side of the quantizer 11 via noise filter 13. Specifically, the noise reduction device includes a level detection unit 19 for detecting the level of the input audio signal, and a frequency analysis circuit 17 for frequency analysis of the input audio signals from one critical band to another. The noise reduction device also includes an equal loudness curve generation circuit 15 for generating the information concerning the equal loudness curve representing the psychoacoustic characteristics of the human being, and an allowable noise spectrum calculation circuit 18 for varying the synthesis ratio of the output of the frequency analysis circuit 17 to the output of the equal loudness curve generating circuit 15 responsive to the output of the level detection unit 19 to give the resultant synthesized information for calculating the allowable noise spectrum based upon the synthesized information. With the quantization noise reducing device, filter characteristics of the noise filter 13 are set on the basis of the output information of the allowable noise spectrum calculation circuit 18.

Thus, in the noise reducing device of the present embodiment, the subtractor 12 for subtracting the input to the quantizer 11 from the output of the quantizer 11 to give a quantization error generated on quantization by the quantizer 11, the noise filter 13 for filtering the output of the subtractor 12 and the adder 10 for summing the output of the noise filter 13 to the input side of the quantizer 11 make up a so-called error feedback circuit. The filter characteristics of the noise filter 13 are set by calculating the filter coefficients by the filter coefficient calculation circuit 14 on the basis of the information concerning the allowable noise spectrum of the allowable noise spectrum calculation circuit 18 as later explained and by sending the filter coefficient information to the noise filter. 13.

Thus, in the above-described error feedback circuit, the quantization error reducing operation, that is the so-called error shaping, is performed on the basis of the allowable noise spectrum as later explained. The processed signal is outputted at the output terminal 2.

When performing the noise shaping processing operation for reducing the quantization error in the audio signals by the above-described error feedback circuit, the so-called masking of the input signal spectrum is taken into account for enhancing the dynamic range as perceived by the ear. Among the processing operations taking the masking effect into account, there is a noise shaping conforming to the spectrum of the input audio signals the signal spectrum pattern of which is fixed to some extent, that is, a noise shaping employing the allowable noise level obtained by taking into account the so-called masking effect of the input audio signal spectrum.

There is also a noise shaping employing the adaptive allowable noise spectrum obtained by taking the masking of the variable input signal spectrum into account.

In addition, the frequency spectrum is split into critical bands, by exploiting the psychoacoustic characteristics of the human being, and frequency analysis is executed from one critical band to another. For splitting the frequency spectrum into the critical bands, the input audio signals are transformed by, for example, fast Fourier transform (FFT) into components on the frequency axis and the amplitude terms Am, m=0 to 1024, are divided into, for example, 25 band groups Gn, n being the band numbers, with n=0 to 24, using critical bandwidth which becomes broader with increased frequency for taking the psychoacoustic characteristics of the human being into account.

The frequency analysis on the critical band basis may be executed by finding the so-called Bark spectrum Bn (sum spectrum) obtained by taking the sum of the respective amplitude terms Am of each critical band in accordance with the following equation (1):

$$Bn = 10 \log_{10} Cn (Pn)^2 \qquad (1)$$

The above sum of the amplitude terms Am may be a peak value, an average value or the sum of the energy of the amplitude terms Am.

In the above equation, n is 0 to 24, Cn is the number of elements, that is the number of amplitude terms or points in the n'th band and Pn is, a peak value in each band. The frequency analysis circuit 17 effectuates splitting on the critical band basis and frequency analysis on the band basis and transmits the output information to the allowable noise calculation circuit 18.

The equal loudness curve generating circuit 15 generates and outputs the information on the equal loudness curve. The noise shaping that is more effective for the hearing sense may be achieved by executing noise shaping employing the allowable noise spectrum obtained with the equal loudness curve being taken into account. Thus, the dynamic range of the playback sound may be improved insofar as the hearing sense of the human being is concerned. The information on the equal loudness curve or the approximate curve is outputted by the equal loudness curve generating circuit 15 and sent to the allowable noise spectrum calculation circuit 18.

Thus the allowable noise spectrum calculation circuit 18 calculates the allowable noise spectrum based upon the output information from the equal loudness curve generating circuit 15 and the output information from the frequency analysis circuit 17. The band-based convolved Bark spectrum Sn may be found by executing convolution (with pre-set weighted functions) of the Bark spectrum Bn of the frequency analysis circuit 17, with the possible influence between the bands taken into account, in accordance with the equation (2):

$$Sn = Hn * Bn \qquad (2)$$

where Hn is the convolution coefficient.

Using the convolved Bark spectrum Sn and a value On, that is a required S/N value, n=0 to 24, the convolved masking threshold value Tn is calculated in accordance with the equations (3) and (4):

$$On = N - Kxn \qquad (3)$$

$$Tn = Sn - On \qquad (4)$$

If N=38, K may be set to 1, in which case the sound quality deterioration may be decreased. That is, the sound having the intensity below the levels of the convolved masking threshold values Tn is masked. Then, using the equation (5):

$$TFn = Tn - Dn \qquad 5)$$

the convolved masking threshold value Tn is deconvolved for calculating the allowable noise level (allowable noise spectrum) TFn. In effect, the dc gain Dn of the convolution by the coefficient Hn is subtracted.

The allowable noise spectrum calculation circuit 18 finds the allowable noise spectrum on the basis of the synthesis information obtained by synthesizing the output information from the frequency analysis circuit, obtained as described above, and the output information from the equal loudness curve generating circuit 15, as explained previously.

The allowable noise level of the allowable noise spectrum derived from the equal loudness curve occasionally becomes lower than the allowable noise level, for which the masking effect operates, depending upon the input audio signal level. That is, if the input audio signal level is high, the allowable noise spectrum level derived from the equal loudness curve may be masked simultaneously by the allowable noise level for which the masking effect operates, for the input audio signal.

In view of the foregoing, in the present embodiment, the input audio signal level is detected by the level detection unit 19, and the synthesis ratio of the output information from the equal loudness curve generating circuit 15 and the output information of the frequency analysis circuit 17 is changed on the basis of the level detection output. The output information of the equal loudness curve generating circuit 15 and the output information of the frequency analysis circuit 17 are synthesized, for example, from one frequency band to another. In such case, level detection by the level detection unit 19 is performed from one band to another. Thus, the synthesis ratio is changed from one band to another on the basis of the band-based level detection output. If the low-range level of the input audio signal is high and the masking effect in the low range of the input audio signal is high, the synthesis information for finding the noise spectrum in the allowable level spectrum calculation circuit 18 is prepared using a synthesis ratio which will give an allowable noise spectrum having a high level and a low level in the low range and in the high range, respectively. Conversely, if the high-range level of the input audio signal is high and the masking effect in the high range of the input audio signal is high, the synthesis information is prepared using a synthesis ratio which will give an allowable noise spectrum having a high level and a low level in the high range and in the low range, respectively. The information on the allowable noise spectrum, thus prepared, is sent to the filter coefficient calculation circuit 14. The filter coefficient calculation circuit 14 outputs filter coefficients conforming to the allowable noise spectrum to the noise filter 13.

Thus the filter characteristics of the noise filter 13 conform to filter coefficients derived from the allowable noise spectrum in which the synthesis ratio is varied from band to band in agreement with the input audio signal level.

That is, with the present fourth embodiment of the noise reducing device, if the input audio signal level is low, the filter characteristics of the noise filter 13 are set so as to be similar to the characteristics of the equal loudness curve for executing the noise shaping. In addition, the characteristics of the noise filter 13 are flattened in agreement with the signal level of the input audio signal level for prohibiting the quantization noise from becoming pronounced with a rise in the input audio signal level. If the signal level is low, the characteristics similar to those of the equal loudness curve are set so as to be closer to flat characteristics in agreement with the signal level for realizing the noise shaping characteristics (masking characteristics) matched to the signal characteristics. That is, the characteristics of the noise filter 13 are set so as to be similar to the equal loudness curve for the low signal level while the masking effect is taken into account in the filter characteristics of the noise filter in case of a larger signal level.

By setting the filter coefficients of the noise filter with the equal loudness curve and the masking effect taken into account as explained in connection with the second to fourth embodiments, for example, by setting filter coefficients on the basis of the information in which the synthesis ratio of the information of the equal loudness curve and the frequency analysis information of the input audio signals is varied responsive to the level of the input audio signal, it becomes possible to reduce the noise as perceived by the ear in order to improve the dynamic range as perceived by the ear.

In the above-described second to fourth embodiments, similar to the above-described first embodiment, since the dither signal from the dither generating circuit 21 of the dither signal output unit 20 is concentrated by the filter 22 in the low energy side and sent to the adder 10, such an output signal is obtained in which the noise in the range from 500 Hz to 4 kHz, for which the hearing sense of the human being exhibits high sensitivity, is lowered and the noise floor is smoothed. In addition, sound quality may be achieved in which the sound clarity and the frequency balance as perceived by the ear are comparable to the sound existing prior to noise shaping.

Figure 14:
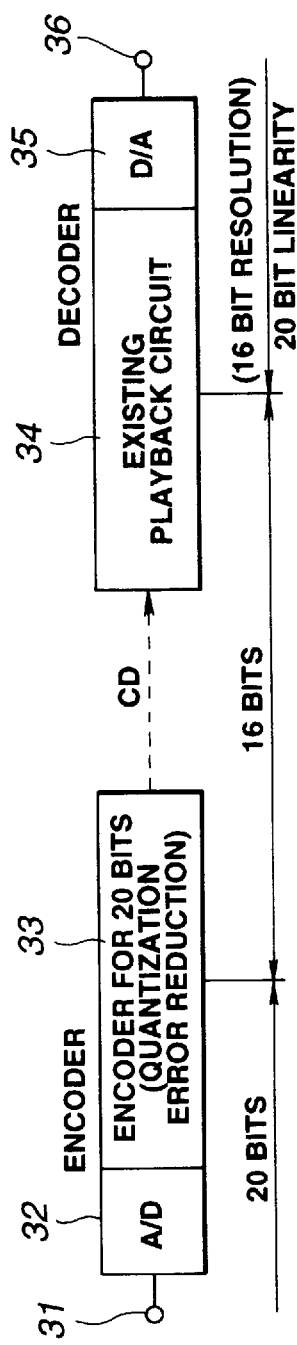
FIG. 14 is a block diagram showing an illustrative embodiment in which the device of the fourth embodiment is applied to an encoder/decoder system for a compact disc.

FIG. 14 shows an illustrative system configuration in which the device of each of the above-described embodiments is used in an encoder/decoder system in a so-called compact disc (CD). In this figure, an analog audio signal is supplied to an input terminal 31. This analog audio signal is converted by an A/D converter 32 into a 20-bit digital signal which is sent to an encoder 33 designed to cope with 20 bits and having enclosed therein the quantization error reducing device of any of the above-described embodiments. This encoder 33 reduces the quantization error and encodes the analog audio signal into 16-bit data which is recorded on the CD. The data thus recorded on the CD is converted by a reproducing circuit 34 and a D/A converter 35 of an existing CD reproducing device so as to be output at an output terminal 36 for playback. That is, since the data recorded on the CD has the quantization error reduced by the quantization error reducing device of the present embodiment, the sound obtained on reproducing the CD has a high dynamic range as perceived by the ear.

Figure 15:
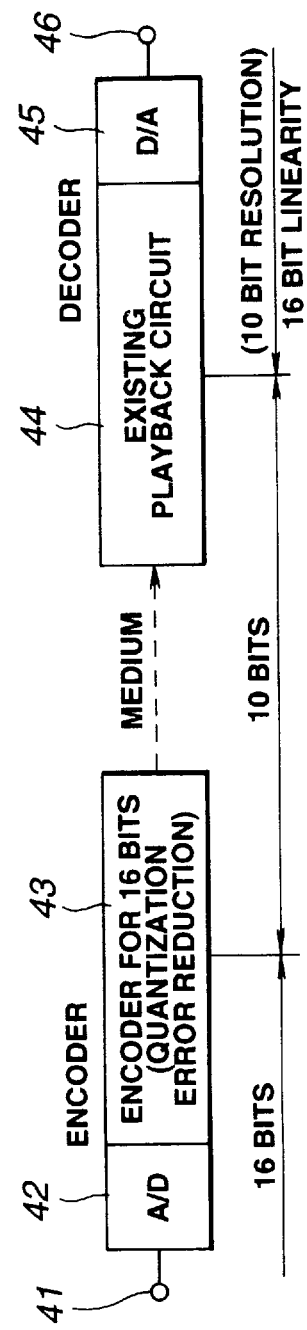
FIG. 15 is a block diagram showing an illustrative embodiment in which the device of the fourth embodiment is applied to a 16-bit system.

FIG. 15 shows an illustrative system configuration employing a recording medium designed for recording data in, for example, 10 bits, in contradistinction from the above CD. In this case, the analog signal supplied to an input terminal is converted by an A/D converter 42 into, for example, 16 bit data which is sent to an encoder 43 designed to cope with 10 bits and having a quantization error reducing device of the present embodiment enclosed therein. The analog signal, reduced in quantization error and encoded into 10-bit data by the encoder 43, is recorded on the recording medium. The data thus recorded on the recording medium is converted by a reproducing circuit 44 and a D/A converter 45 of an existing reproducing device and output at an output terminal 46. This again improves the dynamic range of the playback signals as perceived by the ear.

Figure 16:
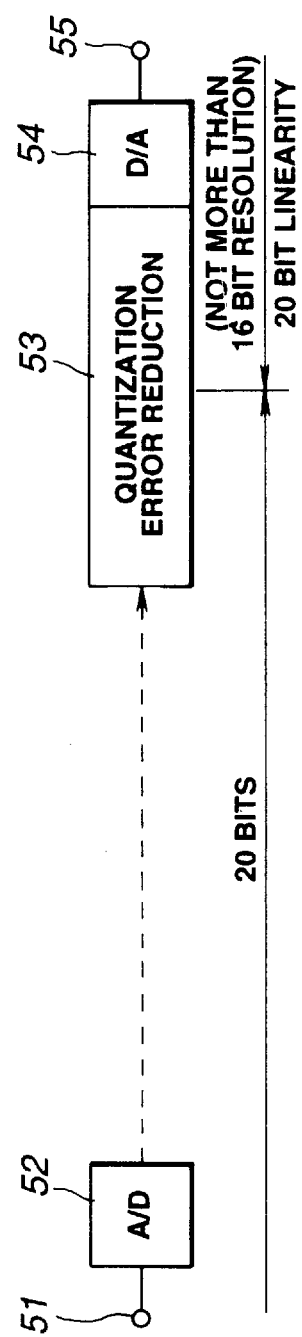
FIG. 16 is a block diagram showing an illustrative embodiment in which the device of the fourth embodiment is applied to a D/A converter system for over-sampling.

FIG. 16 shows an illustrative D/A converting system with over-sampling employing a device of any of the above embodiments. In this case, the analog signal entering an input terminal 51 is converted by an A/D converter 52 with over-sampling into, for example, 20 bit data, which is sent over a transmission path to a quantization error reducing device 53 of any of the present embodiments. The digital data is reduced in quantization error by the quantization error reducing device 53 and converted by a D/A converter 54 into analog signals which are output at an output terminal 55. This achieves over-sampling and lowers the resolution in D/A conversion so that it becomes correspondingly easier to fabricate the D/A converter 54 for improving the linearity.

By applying the noise reducing device according to the present invention to, for example, an existing digital audio equipment of a unification standard, it becomes possible to produce the playback sound, as perceived by the ear, which is enlarged in the dynamic range as compared to the dynamic range actually obtained from the unification standard. That is, the dynamic range of the playback audio signal as perceived by the ear may be improved, using the same reproducing device as before, without changing the unification standard, as the unification standard is maintained. In addition, the superior sound quality represented by the sound clarity and frequency balance as perceived by the ear may be achieved which is close to that of the sound which prevailed before noise shaping.

The present invention is not limited to the above-described embodiments. The number of bits of the input digital audio signals may be set to any arbitrary value without being limited to 20 or 16 bits. The dither signal having the energy concentrated in the low range is also not limited to the embodiment shown in FIG. 9. The dither signal having the energy concentrated in the low range may also be directly produced in the dither generation stage without employing a filter.

What is claimed is:

1. A noise reducing apparatus comprising:
   quantization means for quantizing a signal fed thereto;
   subtraction means for subtracting the signal fed to said quantization means from an output signal of said quantization means;
   first filter means for filtering a signal output from the subtraction means;

dither signal generating means for generating a dither signal having flat frequency characteristics;

a second filter for continuously low-pass filtering a low frequency signal to which human hearing is sensitive from said dither signal to generate a low-pass filtered signal; and addition means for summing the low-pass filtered signal from the second filter with the signal output from the first filter and for providing a summed signal to the quantization means.

2. The noise reducing apparatus as claimed in claim 1, wherein said dither signal means includes a level detector for detecting a level of the input signal and wherein a level of the dither signal is varied depending upon an output of said level detector.

3. The noise reducing apparatus as claimed in claim 1, further comprising:

filter coefficient calculation means for supplying filter coefficients to said first filter and equal loudness curve generating means for sending data concerning equal loudness characteristics to said filter coefficient calculation means for calculating the filter coefficients.

4. A noise reducing apparatus for recording a noise-reduced signal on a recording medium, comprising:

quantization means for quantizing a signal fed thereto;

subtraction means for subtracting the signal fed to said quantization means from an output signal of said quantization means;

a first filter for filtering a signal output from the subtraction means;

dither signal generating means for generating a dither signal having flat frequency characteristics;

a second filter for continuously low-pass filtering a low frequency signal to which human hearing is sensitive from said dither signal to generate a low-pass filtered signal;

addition means for summing the low-pass filtered signal from the second filter with the signal output from the first filter and for providing a summed signal to the quantization means; and means for recording the noise reduced signal from the quantization means on the recording medium.

\* \* \* \* \*